United States Patent
Yan et al.

(10) Patent No.: US 6,620,289 B1
(45) Date of Patent: Sep. 16, 2003

(54) METHOD AND APPARATUS FOR ASYMMETRIC GAS DISTRIBUTION IN A SEMICONDUCTOR WAFER PROCESSING SYSTEM

(75) Inventors: Chun Yan, Santa Clara, CA (US); Yan Ye, Saratoga, CA (US); Diana Xiaobing Ma, Saratoga, CA (US)

(73) Assignee: Applied Materials, Inc, Santa Clara, CA (US)

( * ) Notice: Subject to any disclaimer, the term of this patent is extended or adjusted under 35 U.S.C. 154(b) by 257 days.

(21) Appl. No.: 09/300,563

(22) Filed: Apr. 27, 1999

(51) Int. Cl.[7] .................. H01L 21/306; C23C 16/00
(52) U.S. Cl. ................... 156/345.33; 156/345.34; 156/345.48; 118/723 R; 118/723 I; 118/715; 216/58
(58) Field of Search .............. 156/345, 345.29, 156/345.33, 345.34, 345.48; 118/723 R, 723 E, 723 I, 715; 204/298.07, 298.33; 216/58

(56) References Cited

U.S. PATENT DOCUMENTS 5,449,411 A * 9/1995 Fukuda et al. ........... 118/723 E
5,772,771 A * 6/1998 Li et al. ................... 118/723 I

* cited by examiner

Primary Examiner—Jeffrie R. Lund
(74) Attorney, Agent, or Firm—Moser, Patterson & Sheridan; Joseph Bach

(57) ABSTRACT

A method and apparatus for processing a workpiece in a chamber by providing an asymmetric flow of process gas and processing the workpiece with the process gas. The asymmetric flow counteracts a non-uniform distribution of reactive species in the chamber. The asymmetric flow can be accomplished by introducing the process gas through a plurality of gas nozzles that communicate through a side wall of the chamber proximate a pump port while pumping gas with a pump coupled to the pump port. The inventive method can be used with a conventional processing chamber by only opening the gas nozzles closest to the pump and blocking any other gas nozzles. Alternatively, the method can be implemented in a processing chamber having gas nozzles located only proximate the pump port.

9 Claims, 5 Drawing Sheets

METHOD AND APPARATUS FOR ASYMMETRIC GAS DISTRIBUTION IN A SEMICONDUCTOR WAFER PROCESSING SYSTEM

BACKGROUND OF THE INVENTION

1. Field of the Invention

The invention relates generally to semiconductor wafer processing systems. More specifically, the invention relates to a method and apparatus for etching dielectric films.

2. Description of the Background Art

Semiconductor wafer processing involves processes having multiple steps including deposition steps and etch steps. Many of these processes use a plasma to process the wafer. In a typical etch step, for example a plasma, generated in a process chamber, produces reactive ions, free radicals or both. These reactive species remove (etch) material from the surface of the semiconductor wafer. In the prior art etching systems, the plasma is generated from a process gas introduced to the chamber through the chamber wall by a plurality of (typically four) gas nozzles symmetrically distributed about a pedestal that supports the workpiece in the process chamber. Approximately equal amounts of gas are delivered through each of the four nozzles. A pump, connected to the chamber by a pump port located on one side of the chamber, regulates the pressure in the chamber by continuously exhausting gases. Unfortunately, byproducts of the etch process tend to collect in the vicinity of the pump port. Consequently, there are fewer reactive species near the pump port and more in other parts of the chamber. This skewing of the distribution of reactive species and byproducts in the plasma causes a non-symmetric etching of the workpiece.

In a prior art etching system (such as a metal etch DPS chamber manufactured by Applied Materials, Inc. of Santa Clara, Calif.), if symmetric gas flow is utilized (i.e. process gas flows equally through all four nozzles), as in FIGS. 3a and 3b, the etch contour maps tend to tilt toward the pump, i.e., the etch contour is not symmetric about the center of the wafer. Specifically, FIG. 3a illustrates an etch contour map for an oxide wafer and FIG. 3b illustrates an etch contour map for a BCB wafer.

Thus, there is a need in the art for a method and apparatus for improving the uniformity of the distribution of reactive ions in a plasma process to improve the symmetry of wafer processing.

SUMMARY OF THE INVENTION

The disadvantages heretofore associated with the prior art are overcome by a method and apparatus for processing a workpiece in a chamber by providing an asymmetric flow of process gas and processing the workpiece with the process gas. The asymmetric flow counteracts a non-uniform distribution of reactive species and process byproducts in the chamber. The asymmetric flow can be accomplished by opening one or more gas nozzles located proximate the pump port and blocking one or more other gas nozzles. Consequently, the process gas flows primarily through the gas nozzles located proximate the pump port. As the process gas and process byproducts produced in the chamber are exhausted through the pump port, the process gas is replenished from the nozzles near the pump. Additional control of the non-uniformity can be achieved by providing process gas through a showerhead attached to a lid of the chamber.

The method of the present invention improves the uniformity of, for example, an etch process such as a dielectric etch.

The invention may be embodied in an apparatus comprising a processing chamber having a plurality of asymmetrically distributed gas nozzles communicating through a wall of the chamber located proximate a pump port.

This invention fulfills the need for a method and apparatus that improves the symmetry of plasma processes such as dielectric etch.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
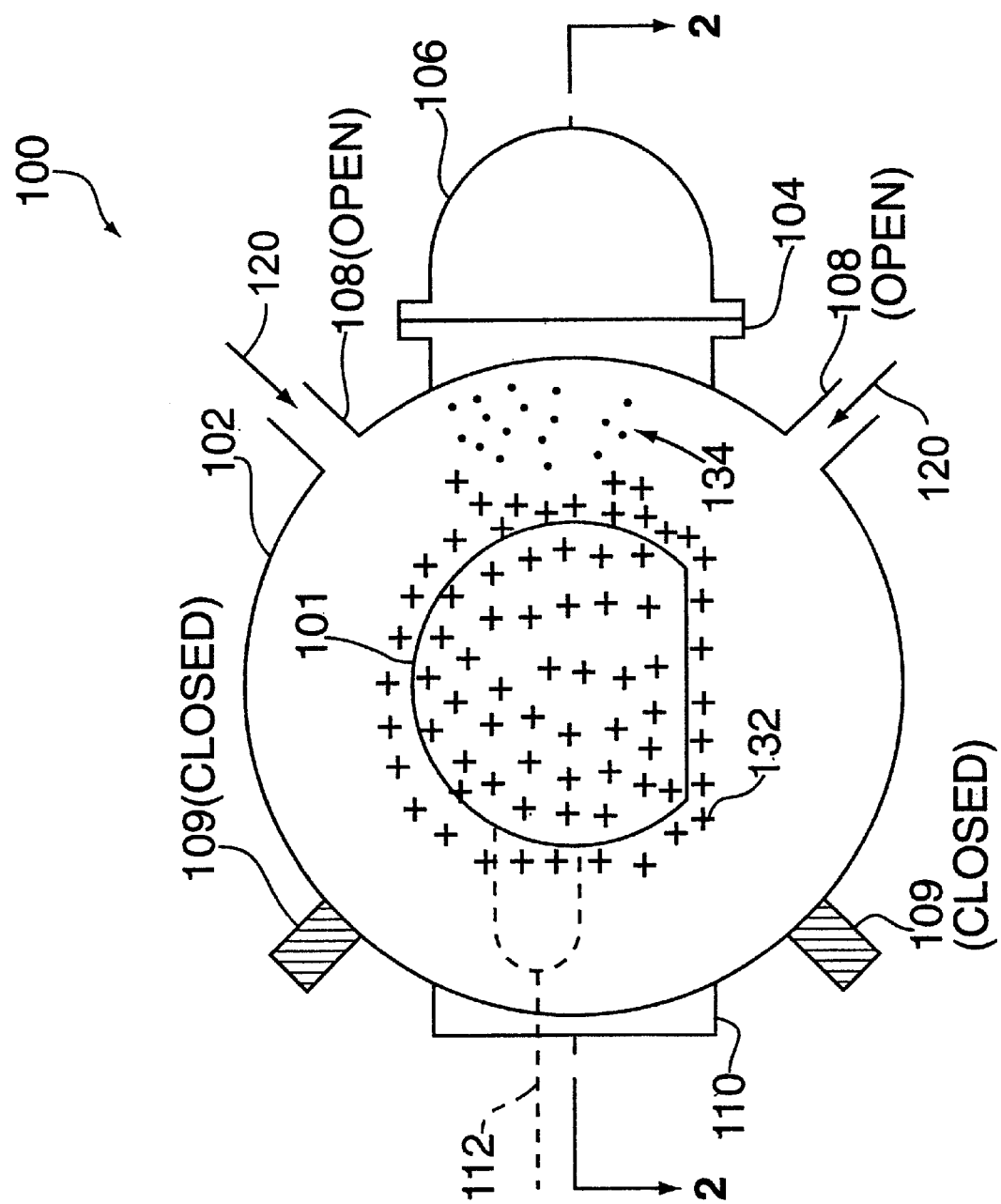
FIG. 1 depicts a horizontal cross sectional schematic view of a semiconductor wafer processing chamber as employed in the method of the present invention taken along line 1—1 of FIG. 2.
Figure 2:
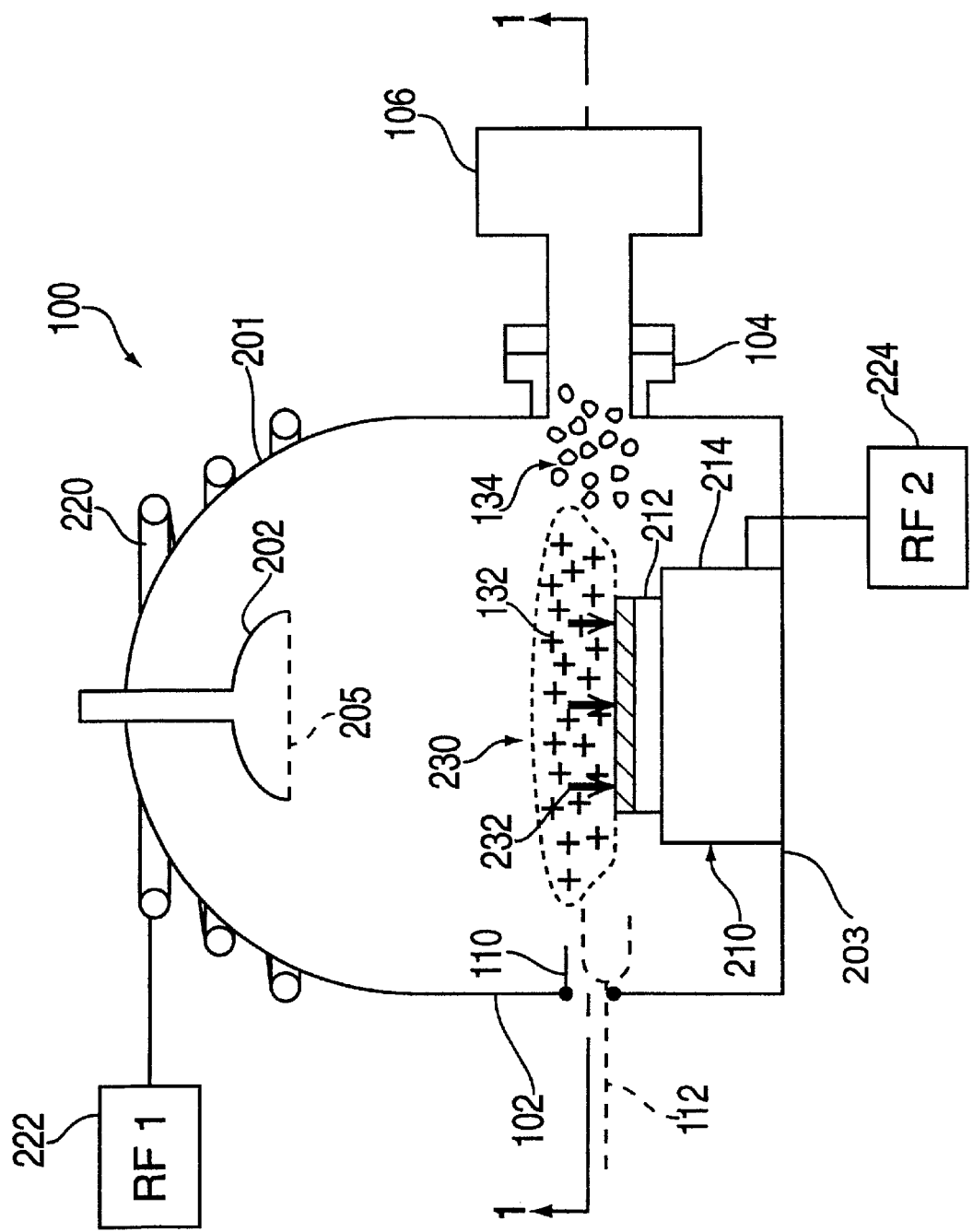
FIG. 2 depicts a vertical cross sectional schematic view of the processing chamber taken along line 2—2 of FIG. 1.

The present invention is best described in terms of a semiconductor wafer processing chamber such as that depicted in FIGS. 1 and 2. The invention is best understood by referring to FIGS. 1 and 2 simultaneously. The chamber 100 has a side wall 102, a lid 201 (dome) and a bottom wall 203. A pump 106 is coupled to the chamber 100 through a pump port 104 that communicates with the interior of the chamber 100. The pump 106 regulates a pressure within the chamber 100 by pumping out gases from the interior. The invention is generally implemented in a Decoupled Plasma Source (DPS) etch chamber manufactured by Applied Materials Inc. of Santa Clara, Calif. This chamber has four process gas inlet ports that are symmetrically distributed about the sidewall 102 of the chamber 100.

In accordance with the invention, process gas is asymmetrically introduced to the chamber 100, for example, only through one or more gas nozzles 108 located proximate the pump port 104. Gas could also be introduced through a single nozzle provided the nozzle lies in a vertical plane that intersects an axis running between a slit valve 110 and the pump port 104.

Process gas flows into the chamber 100 as indicated by arrows 120. Other gas nozzles such as nozzles 109 may be located opposite the pump port 104, however, these nozzles 109 are closed to produce a non-uniform gas flow in accordance with the method of the present invention. Alternatively, a small flow of gas can be provided to the nozzles 109 while a larger flow of gas is provided through the nozzles 108. Asymmetric gas flow is also possible with process gas flow provided from the top of the chamber. For example, a showerhead 202, attached to the lid 201 of the chamber 100, delivers process gas through a plurality of apertures 205. To facilitate asymmetric gas distribution within the chamber, the showerhead apertures 205 are not uniformly distributed across the showerhead 202. Such a showerhead 202 may be used in conjunction with the nozzles 108 or in lieu of the nozzles 108.

The chamber 100 further includes the necessary elements for processing a wafer. For example, the chamber 100 is equipped with a wafer support 210 (depicted in FIG. 2), slit valve 110, and a robot arm 112. The wafer support 210 comprises a susceptor 212 mounted to a pedestal 214. The pedestal 214 is typically fabricated from a metal such as aluminum. The susceptor 212 is typically fabricated from a dielectric material such as a polyimide or ceramic. Normally, a workpiece such as a semiconductor wafer 101 rests on the susceptor 212 during processing. The susceptor 212 includes components such as resistive heaters, bias electrodes or electrostatic chuck electrodes. The latter can be implemented using any number of chucking electrodes and any type of chucking electrode structure including monopolar, bipolar, tripolar, interdigitated, zonal and the like. Similarly, any number or arrangement of heaters can be used including a single heater, or two or more heaters can be used for zoned heating and the like.

A workpiece such as a semiconductor wafer 101 is introduced to the interior of the chamber 100 through a slit valve 110. The robot arm 112 (shown in phantom) positions the wafer 101 on the wafer support 210. To operate the chamber 100 by the method of the present invention, the gas nozzles 108 located proximate the pump port 104 are opened. Other gas nozzles, such as the nozzles 109 located opposite the pump port 104 are closed. A process gas (such as argon, $CF_4$ and/or $CHF_3$ for oxide etch) is introduced to the chamber through the nozzles 108 proximate the pump port 104 as indicated by the arrows 120. For BCB etch, $Cl_2$ and/or $O_2$ are used as the process gases and, for Al etch, $Cl_2$, $BCl_3$, and $N_2$ are used as the process gases.

The process gas is used to process the wafer 101. For example, reactive species (e.g., ions, free radicals, or molecules) 132 and byproducts 134 are generated from the process gas by a plasma process occurring in the chamber 100. The reactive species 132 process the workpiece 101. For example, in an etch process the reactive species react with the workpiece 101 in such a way as to remove material from the surface of the workpiece. The byproducts 134 tend to collect near the pump port 104 and decrease the local density of reactive species on the side of the wafer 101 proximate the pump port 104. However, because the process gas introduced proximate the pump port 104, there is a greater flow of process gas proximate the pump port 104. This tends to increase the local density of reactive species 132 on the side of the wafer 101 proximate the pump port 104. As such, the density of reactive species 132 becomes more symmetric about the center of the wafer 101. Since the processing rate (e.g., the etch rate) depends on the density of reactive species, the processing of the wafer 101 becomes more symmetric. The showerhead 202 may provide an additional flow of process gas that can be adjusted to optimize the symmetry of wafer processing.

The chamber can be any type of process chamber suitable for performing plasma enhanced wafer processing such as etch, physical vapor deposition (PVD), chemical vapor deposition (CVD), and the like. The chamber 100 is, for example, an etch chamber such as the DPS chamber manufactured by Applied Materials of Santa Clara, Calif. A coil 220 connected to a first radio frequency (RF) power supply 222 supplies RF energy to inductively ignite and maintain the plasma 230 within the chamber 100. A second RF power supply 224 is connected to the pedestal 214 which acts as a cathode. Alternately, RF power can be supplied to an RF bias electrode (not shown) within the susceptor 212. RF voltage supplied by the second RF supply 224 to the cathode controls a bias applied to the workpiece. The bias produces an electric field 232 proximate a surface of the workpiece that is to be etched. Reactive ions 132 from the plasma 230 are accelerated toward the workpiece by the electric field and preferentially etch the workpiece in the direction of the electric field. An asymmetric flow of process gas, e.g., from the gas nozzles 108 and/or the showerhead 202, controls the etch symmetry of the workpiece as described above.

Figure 3A:
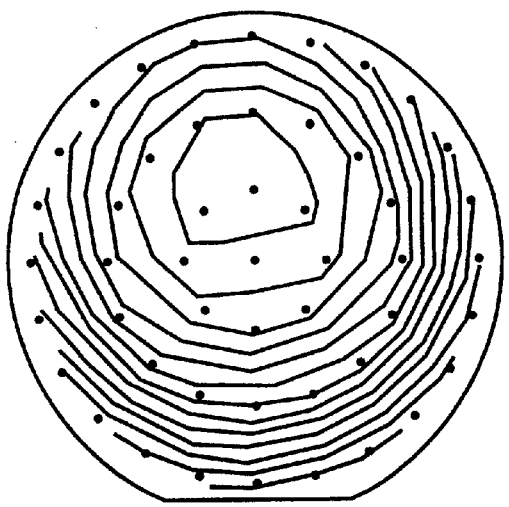
FIGS. 3a–3b depict etch contour maps for BCB and Oxide wafers using the method of the prior art.
Figure 3C:
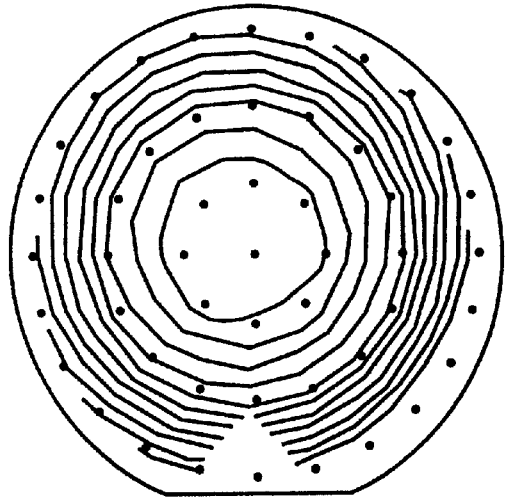
FIGS. 3c–3d depict etch contour maps for BCB and Oxide wafers using the method of the present invention.
Figure 3B:
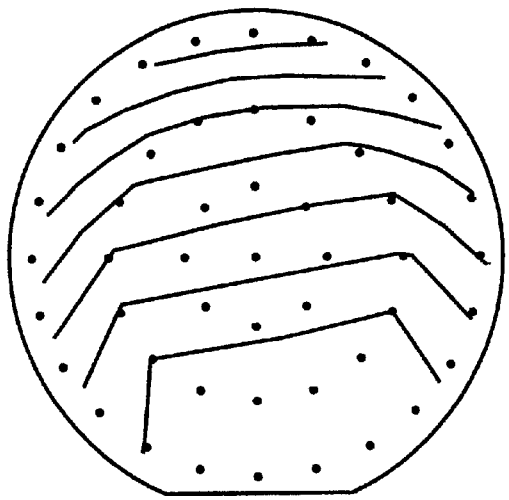
Figure 3D:
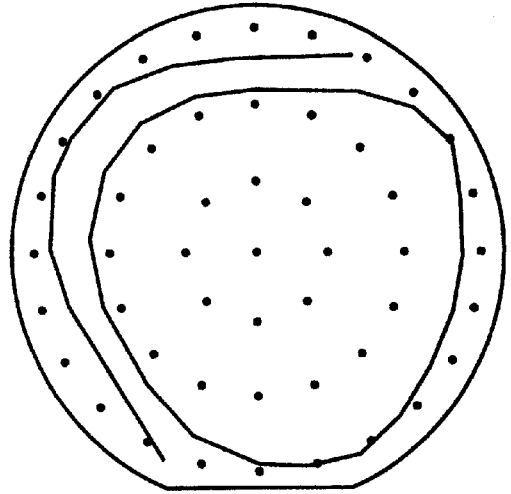

The improved symmetry of wafer processing with a symmetric gas flow is illustrated for a dielectric etch process in FIGS. 3c–3d. FIG. 3c depicts etch contours for a BCB wafer while FIG. 3d depicts etch contours for an oxide wafer (e.g., $SiO_2$).

When the process gas is introduced only through the two nozzles 108 proximate the pump port 104 the asymmetry (tilting) of the etch contours seen in FIGS. 3c and 3d is less pronounced. In particular, the BCB wafer etch contour map shown in FIG. 3c exhibits contours that are less skewed, i.e., more symmetric about the wafer center, than depicted in FIG. 3a. The oxide wafer etch contour map shown in FIG. 3d exhibits a large central contour indicative of a greatly improved etch uniformity.

Figure 4:
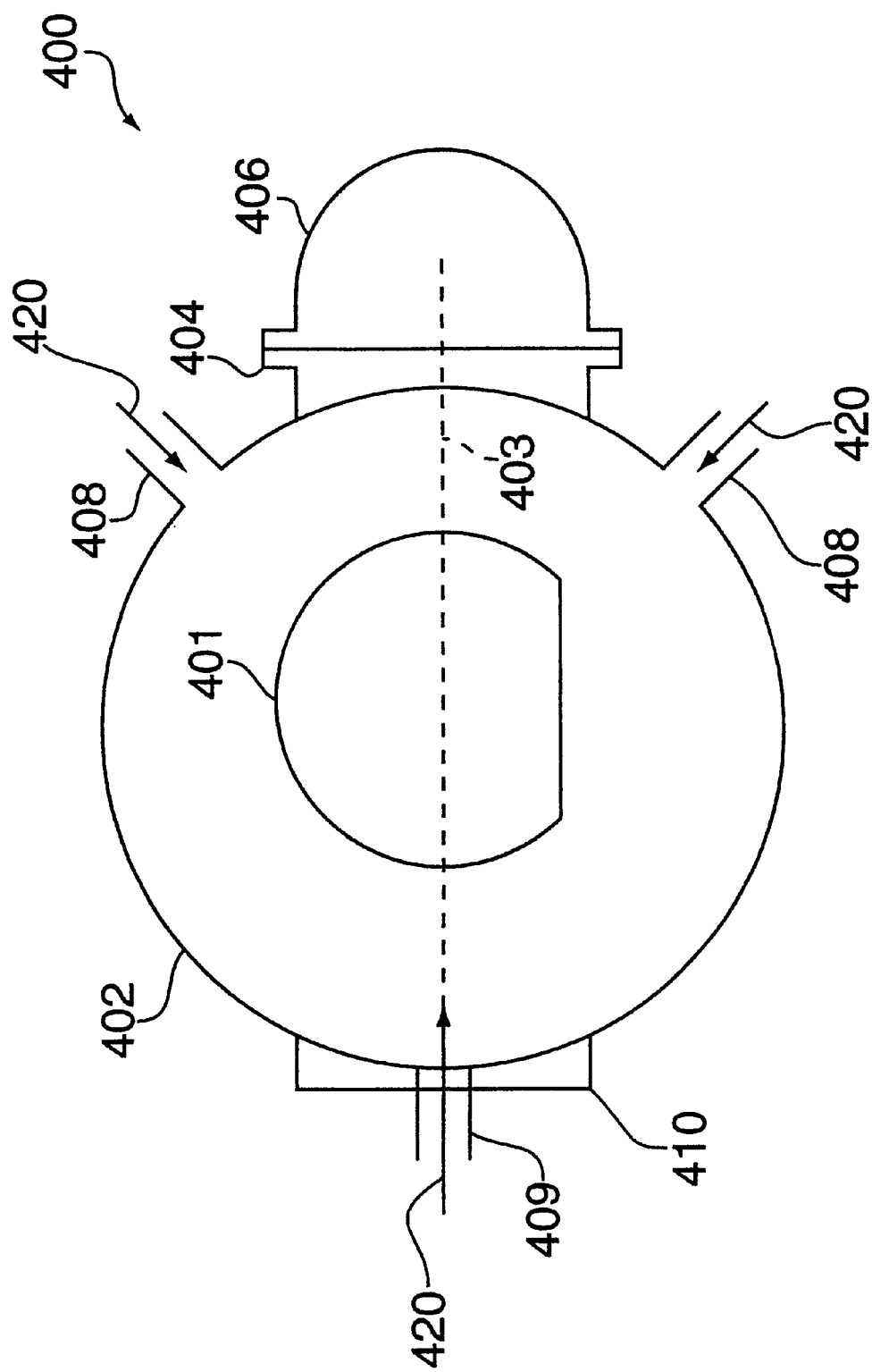
FIG. 4 depicts a horizontal cross sectional schematic view of a semiconductor wafer processing chamber of the present invention.
Figure 5:
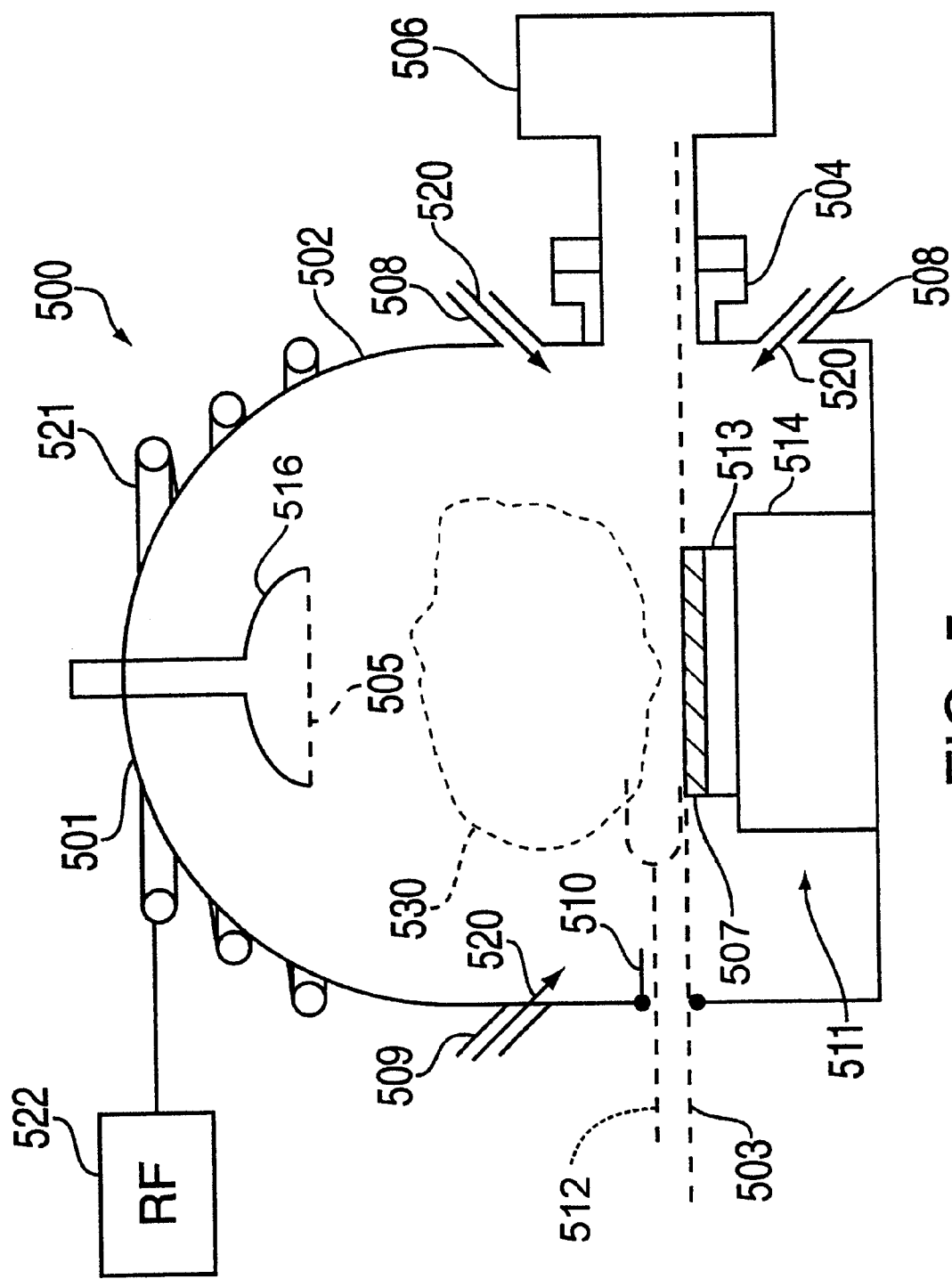
FIG. 5 depicts a vertical cross sectional schematic view of a semiconductor wafer processing chamber of an alternative embodiment of the present invention.

These results of the use of asymmetric process gas flow in a DPS etch chamber suggest a new configurations for the semiconductor wafer processing chambers depicted in FIGS. 4 and 5. Each chamber 400, 500 has a side wall 402, 502 a pump port 404, 504 that communicates with the interior of the chamber 400, 500. Pumps 406, 506 are coupled to the chambers 400, 500 through the pump ports 404, 504. Process gases are asymmetrically introduced to the chamber through one or more gas nozzles 408, 508 located mostly proximate the pump ports 404, 504. The process gases flow into the chambers 400, 500 as indicated by arrows 420, 520. The nozzles 408 are, for example, distributed parallel to the plane of the wafer 401, as depicted in FIG. 4. Alternatively, the nozzles 508 are vertically disposed above and below the pump port 500 within a plane that is perpendicular to the plane of the wafer 507 as depicted in FIG. 5. Other configurations of the nozzles that lead to asymmetric gas flow are also possible. For example, the tuft chambers 400, 500 may be provided with gas nozzles distributed both parallel to and perpendicular to the plane of the wafer, i.e., the nozzles are distributed about the pump port. Alternatively, the chambers 400, 500 may be provided with nozzles at any angle with respect to the plane of the wafer.

Gas nozzles 409, 509 may also be provided opposite the pump ports 404, 504 to further control process gas flow. The nozzles 409, 509 are, for example distributed symmetrically with respect to a pump port-slit valve axis 403, 503. A lesser flow of gas of provided through the nozzles 409, 509 opposite the pump ports 404, 504 than through the nozzles 408, 508 located proximate the pump ports. Asymmetric gas flow may be further controlled with process gas flow provided through a shower head 516 having a plurality of orifices 505, depicted in FIG. 5 attached to a lid 501 of the chamber 500.

The chambers 400, 500 are, by way of example, etch chambers that further include the necessary elements for processing a wafer 401, 501. For example, the chamber 500 is equipped with wafer support 511 (depicted in FIG. 2), slit valve 510, and robot arm 512. The wafer support 511 comprises a susceptor 513 mounted to a pedestal 514. A coil 521 connected to a RF source 522 inductively supplies RF energy to ignite and maintain a plasma 530 within the chamber 500 to process the wafer 501.

Although various embodiments which incorporate the teachings of the present invention have been shown and described in detail herein, those skilled in the art can readily devise many other varied embodiments that still incorporate these teachings.

What is claimed is:

1. A method for processing a workpiece in a chamber having a plurality of gas nozzles, comprising the steps of:

selectively opening a first number of the plurality of gas nozzles while selectively blocking a second number of the plurality of gas nozzles;

introducing an asymmetric flow of process gas to the chamber through said selectively opened first number of gas nozzles; and processing the workpiece with said process gas to perform an etching process.

2. The method of claim 1 wherein said asymmetric flow counteracts a non-uniform distribution of reactive species and by products in the chamber.

3. The method of claim 2 further comprising the step of:

pumping said process gas out of said chamber through said pump port.

4. The method of claim 1 wherein said process gas is introduced to the chamber through one or more of gas nozzles proximate a pump port.

5. The method of claim 1 wherein said process gas is provided from a top of the chamber.

6. A method for processing a workpiece in a chamber having a pump port and a plurality of gas nozzles comprising the steps of:

opening one or more gas nozzles located proximate the pump port while blocking one or more other gas nozzles;

flowing a process gas through the gas nozzles located proximate the pump port;

exhausting the chamber through the pump port; and processing the workpiece with said process gas.

7. The method of claim 6 further comprising the step of introducing a second process gas through a top wall of the chamber.

8. The method of claim 7 wherein said processing step includes an etch process.

9. Apparatus for processing a workpiece, comprising:

a processing chamber having a wall;

a pump port, communicating through said wall;

one or more of gas nozzles, communicating through said wall, said gas nozzles being located mostly proximate said pump port;

a pump coupled to said processing chamber through said pump port; and a lid, having a showerhead, disposed over said wall of said processing chamber.

\* \* \* \* \*